(12) United States Patent
Kusumi et al.

(10) Patent No.: US 9,386,718 B2
(45) Date of Patent: Jul. 5, 2016

(54) DIN-RAIL MOUNT TYPE DEVICE

(71) Applicant: KABUSHIKI KAISHA YASKAWA DENKI, Kitakyushu-shi (JP)

(72) Inventors: Michinori Kusumi, Kitakyushu (JP); Hajime Uesugi, Kitakyushu (JP); Naoto Munehiro, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 462 days.

(21) Appl. No.: 13/961,891

(22) Filed: Aug. 8, 2013

(65) Prior Publication Data

US 2013/0322044 A1    Dec. 5, 2013

Related U.S. Application Data

(63) Continuation of application No. PCT/JP2012/051364, filed on Jan. 23, 2012.

(30) Foreign Application Priority Data

Feb. 17, 2011 (JP) ................................. 2011-032062

(51) Int. Cl.
*H05K 7/14* (2006.01)
*H02B 1/052* (2006.01)
*H05K 5/02* (2006.01)
*H05K 7/12* (2006.01)

(52) U.S. Cl.
CPC ................ *H05K 7/14* (2013.01); *H02B 1/0523* (2013.01); *H05K 5/0204* (2013.01); *H05K 7/12* (2013.01)

(58) Field of Classification Search
CPC .................................... H05K 7/12; H05K 7/14
See application file for complete search history.

(56) References Cited

U.S. PATENT DOCUMENTS

| 5,192,227 | A | * | 3/1993 | Bales | ................... | H01R 9/2608 |
| | | | | | | 439/532 |
| 5,704,805 | A | * | 1/1998 | Douty | .................. | H01R 9/2608 |
| | | | | | | 439/532 |
| 5,904,592 | A | * | 5/1999 | Baran | .................... | H02B 1/052 |
| | | | | | | 361/627 |
| D529,453 | S | * | 10/2006 | Schurr | ......................... | D13/110 |

(Continued)

FOREIGN PATENT DOCUMENTS

| JP | 55-150520 | 11/1980 |
| JP | 57-088988 U | 11/1980 |

(Continued)

OTHER PUBLICATIONS

Korean Office Action for corresponding KR Application No. 10-2013-7021449, Jun. 25, 2014.

(Continued)

*Primary Examiner* — David Warren
(74) *Attorney, Agent, or Firm* — Mori & Ward, LLP (57) ABSTRACT

This disclosure discloses a DIN-rail mount type device. The DIN-rail mount type device includes a housing, a rail groove provided along a width direction of the housing on a face of the housing and being capable of fitting with the DIN rail, a slider groove provided along a width direction of the rail groove on the face of the housing; and a lock member. The lock member configured to slide so as to move forward and backward with respect to the rail groove in the slider groove, and to be able to retain a fitting state between the rail groove and the DIN rail by engaging a one-side end with an engagement portion of the DIN rail fitted into the rail groove.

16 Claims, 8 Drawing Sheets

(56) References Cited

U.S. PATENT DOCUMENTS

| | | | | |
|---|---|---|---|---|
| 7,374,453 | B1* | 5/2008 | Allcock | B66C 7/08 439/532 |
| 8,062,061 | B2* | 11/2011 | Lim | H02B 1/052 439/532 |
| 9,088,138 | B2* | 7/2015 | Yu | H02B 1/0526 |
| 9,125,317 | B2* | 9/2015 | Kho | H02B 1/052 |
| 2005/0175402 | A1* | 8/2005 | Schurr | H02B 1/052 403/331 |
| 2005/0248925 | A1* | 11/2005 | Cane | H05K 5/061 361/737 |
| 2006/0079124 | A1* | 4/2006 | Barile | H02B 1/052 439/532 |
| 2006/0175489 | A1* | 8/2006 | Portal | H01R 9/2608 248/215 |
| 2008/0299820 | A1* | 12/2008 | Schelonka | H01R 9/2608 439/532 |
| 2010/0128448 | A1* | 5/2010 | Wenlong | H02B 1/052 361/747 |
| 2010/0285690 | A1* | 11/2010 | Molnar | H02B 1/052 439/532 |
| 2010/0314522 | A1* | 12/2010 | Molnar | H02B 1/052 248/346.06 |
| 2013/0316552 | A1* | 11/2013 | Sasano | H01R 9/2608 439/122 |
| 2014/0131543 | A1* | 5/2014 | Goto | G10H 1/348 248/429 |
| 2014/0139976 | A1* | 5/2014 | Santoni | F16B 1/00 361/605 |
| 2014/0199864 | A1* | 7/2014 | Devanand | H01R 9/2608 439/116 |
| 2014/0205371 | A1* | 7/2014 | Bally | A61G 12/008 403/327 |

FOREIGN PATENT DOCUMENTS

| | | |
|---|---|---|
| JP | 01-121989 U | 8/1989 |
| JP | 01-208895 | 8/1989 |
| JP | 01-137589 U | 9/1989 |
| JP | 04-032584 U | 3/1992 |
| JP | 04-087692 U | 7/1992 |
| JP | 3453739 B2 | 8/1994 |
| JP | 07-026870 Y2 | 6/1995 |
| JP | 11-054960 | 2/1999 |
| JP | 11-103181 | 4/1999 |
| JP | 2003-298252 | 10/2003 |
| TW | M350226 U | 2/2009 |

OTHER PUBLICATIONS

Extended European Search Report for corresponding EP Application No. 12747088.8-1801, Jun. 25, 2014.
Chinese Office Action for corresponding CN Application No. 201280009256.8, Apr. 14, 2015.
Korean Office Action for corresponding KR Application No. 10-2013-7021449, Nov. 13, 2014.
International Search Report for corresponding International Application No. PCT/JP2012/051364, Feb. 21, 2012.
Written Opinion for corresponding International Application No. PCT/JP2012/051364, Feb. 21, 2012.
Taiwanese Office Action for corresponding TW Application No. 101105110, Sep. 25, 2015.

* cited by examiner

DIN-RAIL MOUNT TYPE DEVICE

CROSS-REFERENCE TO RELATED APPLICATION

This is a continuation application PCT/JP2012/051364, filed Jan. 23, 2012, which was published under PCT article 21(2) in English.

FIELD OF THE INVENTION

The disclosed embodiment relates to a DIN-rail mount type device which is removably mounted to a DIN rail.

DESCRIPTION OF THE RELATED ART

The DIN-rail mount type device of prior art which is removably mounted to the DIN rail is known.

SUMMARY OF THE INVENTION

According to one aspect of the disclosure, there is provided a DIN-rail mount type device which is removably mounted to a DIN rail includes a housing, a rail groove provided along a width direction of the housing on a face of the housing and being capable of fitting with the DIN rail, a slider groove provided along a width direction of the rail groove on the face of the housing, and a lock member configured to slide so as to move forward and backward with respect to the rail groove in the slider groove, and to be able to retain a fitting state between the rail groove and the DIN rail by engaging a one-side end with an engagement portion of the DIN rail fitted into the rail groove. The lock member is configured to be able to move to a first position where the one-side end protrudes from the slider groove into the rail groove, and other-side edge protrudes out of the housing and to a second position where the one-side end protrudes from the slider groove into the rail groove and the other-side end is stored in the slider groove, configured to be able to retain the fitting state between the rail groove and the DIN rail by engaging the one-side end with the engagement portion of the DIN rail at the first position, and configured to be able to move to the second position only when the DIN rail is not fitted into the rail groove.

DESCRIPTION OF THE EMBODIMENTS

With reference to drawings, an embodiment will be described below. When "front", "back", "left", "right", "up", and "down" are noted in each drawing below, a "frontward", "backward", "leftward", "rightward", "upward", and "downward" in the description of the specification indicate the noted directions.

Figure 1:
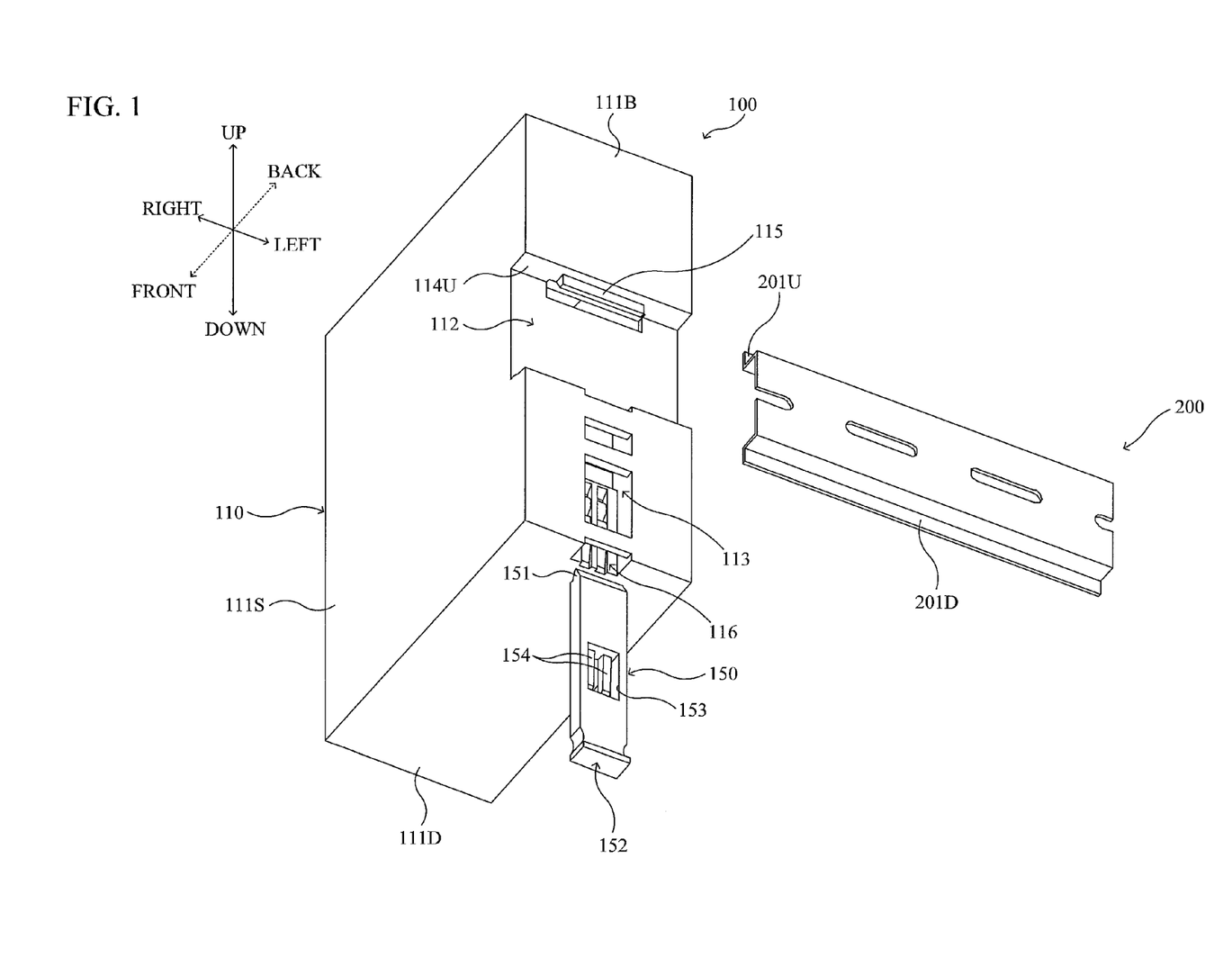
FIG. 1 is a perspective view illustrating an outer appearance of a DIN-rail mount type device according to an embodiment.

In FIGS. 1, 2A and 2B, and FIGS. 3A and 3B, a DIN-rail mount type device 100 according to a present embodiment is referred to a device removably mounted to a DIN rail 200 complying with DIN (Deutsche Industrie Normen: German Industry Standard). As the DIN-rail mount type device 100, for example, a control device such as a controller unit, PLC (programmable logic controller) unit, inverter unit, servo unit, power unit, I/O unit, sensor unit, switch unit, safety unit, and relay unit is used. Alternatively, devices other than the control device may be used. As illustrated in FIG. 1, the DIN-rail mount type device 100 includes a front face that is a fore face (not illustrated), a back face 111B that is a rear face, an upper face 111U (refer to FIG. 2B), a lower face 111D, and right and left side faces 111S, and includes a housing 110 formed in a substantially cuboidal shape, and a lock member 150. According to the present embodiment, the back face 111B of the housing 110 corresponds to a face of the housing described in claims. Alternatively, a face other than the back face 111B of the housing 110 (e.g., front face and the like of the housing 110) may be used as a face of the housing.

Figure 2A:
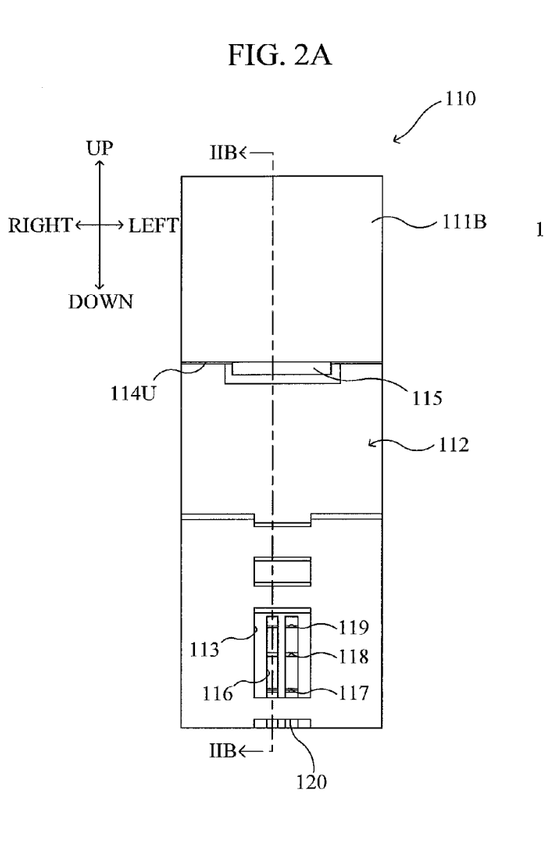
FIG. 2A is a plan view of a housing viewed from a back face side thereof.
Figure 2B:
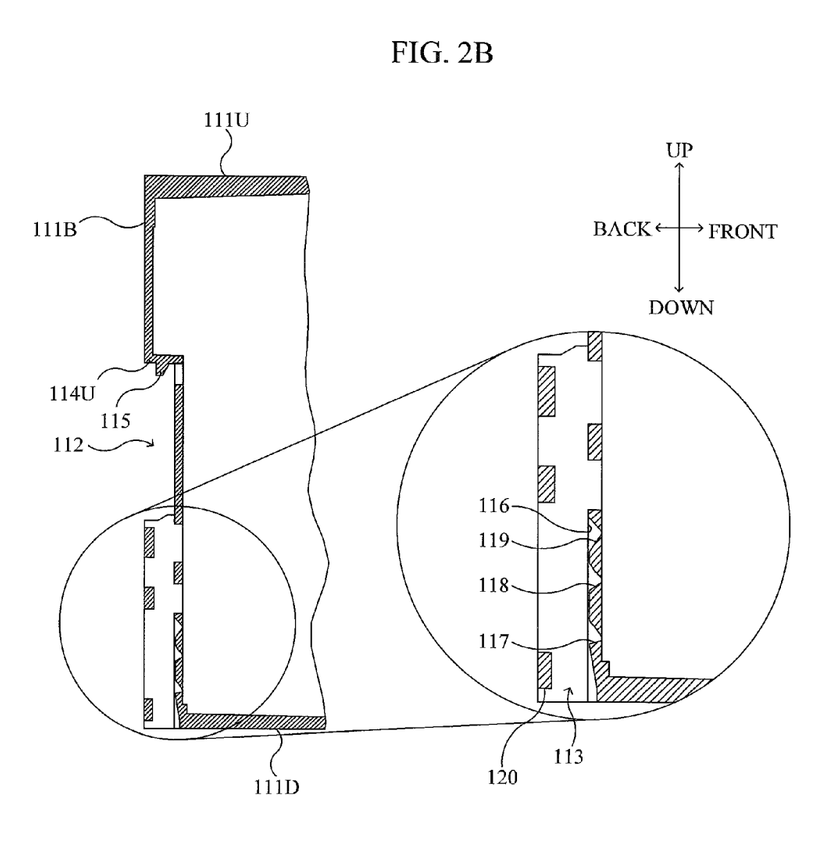
FIG. 2B is a vertical cross-sectional view thereof along the line IIB-IIB in FIG. 2A.

As illustrated in FIG. 1 and FIGS. 2A and 2B, the back face 111B of the housing 110 is provided with a rail groove 112 capable of fitting with a DIN rail 200 to extend all over a length in a right and left direction of the back face 111B along a width direction, in other words, the right and left direction of the housing 110. An edge (appropriately described as an "upper side edge" hereinafter) 114U at an upper side of the rail groove 112 is protrudingly provided with an engagement portion 115 to be engaged with an engagement portion (appropriately described as an "upper-side engagement portion" hereinafter) 201U at the upper side of the DIN rail 200.

Further, a face at a lower side than the rail groove 112 on the back face 111B of the housing 110 is provided with a slider groove 113 to be slidably fitted with the lock member 150 to extend all over the length in an upward and downward direction of the face along the width direction, in other words, the upward and downward direction of the rail groove 112. A bottom face corresponding to a front side of the slider groove 113 is provided with a groove 116 extending upward from the lower edge of the bottom face along the upward and downward direction to correspond to a position of a spring portion 154 (details will be described below) provided for the lock member 150.

As illustrated in FIGS. 2A and 2B, the groove 116 is provided with three recesses 117, 118, and 119 capable of engaging with a tip end 154T of the spring portion 154 provided for the lock member 150 (refer to FIG. 3B, details will be described below).

Of the above-described recesses 117, 118, and 119, as described below with reference to FIG. 4B, the recess 117 provided at the lowest side is the recess to be engaged with the tip end 154T of the spring portion 154 when the lock member 150 moves to an unlock position described below. Hereinafter, this recess 117 is appropriately described as the "unlocking recess 117".

Of the above-described recesses 117, 118, and 119, as described below with reference to FIG. 6B, the recess 118 provided between the unlocking recess 117 and the recess 119 is the recess to be engaged with the tip end 154T of the spring portion 154 when the lock member 150 moves to the lock position described below. Hereinafter, this recess 118 is appropriately described as the "locking recess 118".

Of the above-described recesses 117, 118, and 119, as described below with reference to FIG. 7B, the recess 119 provided at a top side is the recess to be engaged with the tip end 154T of the spring portion 154 when the lock member 150 moves to the storage position described below. Hereinafter, this recess 119 is appropriately described as the "storing recess 119".

Figure 3A:
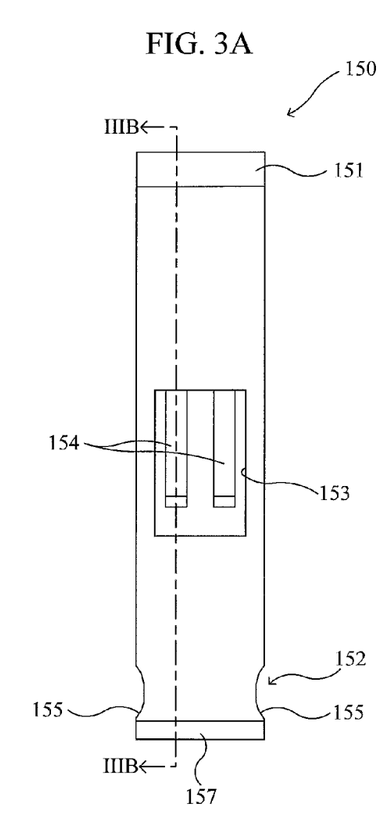
FIG. 3A is a plan view of a lock member viewed from a face side corresponding to the back face side of the housing.
Figure 3B:
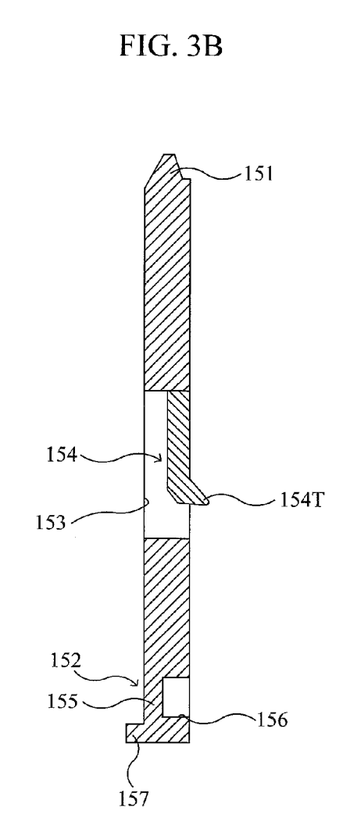
FIG. 3B is a vertical cross-sectional view of the lock member along the line IIIB-IIIB in FIG. 3A.

As illustrated in FIG. 1 and FIGS. 3A and 3B, the lock member 150 slides along the upward and downward direction to move forward and backward with respect to the rail groove 112 in the slider groove 113, and an engagement-side end 151 that is an end (one-side end) at a side corresponding to the upper side of the lock member 150 is engaged with an engagement portion (appropriately described as a "lower-side engagement portion" hereinafter) 201D at a lower side of the DIN rail 200 fitted into the rail groove 112, in the manner that a fitting state between the rail groove 112 and the DIN rail 200 can be retained. The lock member 150 can slide along the upward and downward direction between the unlock position and the storage position in the slider groove 113, and can move to the unlock position, the lock position, and the storage position.

The unlock position refers to a position (position of the lock member 150 indicated below with reference to FIGS. 4A and 4B) where the engagement-side end 151 is stored in the slider groove 113 and an operation-side end 152 that is an end (other-side end) at a side corresponding to a lower side of the lock member 150 protrudes more downward out of the housing 110. The unlock position corresponds to a third position described in claims.

The lock position refers to a position (position of the lock member 150 indicated below with reference to FIGS. 6A and 6B) where the engagement-side end 151 protrudes more upward than the slider groove 113, in other words, into the rail groove 112, and further the operation-side end 152 protrudes more downward out of the housing 110. The lock position corresponds to a first position described in claims. The lock member 150, at this lock position, engages the engagement-side end 151 with an engagement portion 201D at a lower side of the DIN rail 200 to retain the fitting state between the rail groove 112 and the DIN rail 200 (details will be described below).

The storage position refers to a position (position of the lock member 150 indicated below with reference to FIGS. 7A and 7B) where the engagement-side end 151 protrudes from the slider groove 113 into the rail groove 112, and the operation-side end 152 is stored in the slider groove 113. The storage position corresponds to a second position described in claims. When the DIN rail 200 is not fitted into the rail groove 112, in other words, only when the DIN-rail mount type device 100 is removed from the DIN rail 200, the lock member 150 can move to this storage position.

Further, the lock member 150 includes a through hole 153 provided along a direction corresponding to a forward and backward direction, and two spring portions 154 that are extendedly provided at the edge of a side corresponding to the upper side of the through hole 153 in a direction corresponding to a downward direction and is capable of being elastically bent in a direction corresponding to a depth direction, in other words, the forward and backward direction of the housing 110. According to this example, the number of the spring portions 154 is defined as two, but, the number of the spring portions 154 is not limited thereto, and may be one, or three or more. Further, according to this example, the spring portion 154 is extendedly provided at the edge of the side corresponding to the upper side of the through hole 153 in the direction corresponding to the downward direction, but, the spring portion 154 is not limited thereto, and may be extendedly provided at the edge of the side corresponding to the lower side of the through hole 153 in a direction corresponding to an upward direction.

The spring portion 154 is formed to protrude in a direction corresponding to a frontward direction, and includes the above-described unlocking recess 117 provided in the slider groove 113 and corresponding to the unlock position, the above-described locking recess 118 corresponding to the lock position, and the tip end 154T capable of engaging with the above-described storing recess 119 corresponding to the storage position. When the lock member 150 slides in the slider groove 113, the tip end 154T of the spring portion 154 is sequentially engaged with the unlocking recess 117, the locking recess 118, and the storing recess 119, in the manner that the lock member 150 can be retained at the unlock position, the lock position, and the storage position.

Specifically, when the lock member 150 slides in the slider groove 113, while the spring portion 154 is being elastically bent in the forward and backward direction, the spring portion 154 engages the tip end 154T with any of the unlocking recess 117, the locking recess 118, and the storing recess 119 and releases the engagement of the tip end 154T therewith. More specifically, when the lock member 150 slides in the slider groove 113 while the spring portion 154 is being elastically bent backward and the tip end 154T reaches any of the recesses of the unlocking recess 117, the locking recess 118, and the storing recess 119, bending backward becomes smaller in the manner that the tip end 154T is engaged with the reached recess and retains the lock member 150 at a corresponding position. When the lock member 150 slides to another position, the spring portion 154 is elastically bent backward to release the engagement between the tip end 154T and the above-described recess and enables the lock member 150 to move.

Further, the operation-side end 152 of the lock member 150 includes a dent 155, a recess 156, and a protrusion 157 as illustrated in FIGS. 3A and 3B. The dent 155 is a part inwardly dented on a face in a direction corresponding to the right and left direction. The recess 156 is provided on a face in a direction corresponding to a forward direction. By providing the dent 155 and the recess 156 at the operation-side end 152, the operator can hold (pick) the dent 155 and operate the recess 156 with a driver in a state where the operation-side end 152 protrudes downward out of the housing 110, and then can operate the operation-side end 152 to operate the lock member 150. The protrusion 157 is protrudingly provided on a face in a direction corresponding to a backward direction.

When the operation-side end 152 is stored in the slider groove 113, the protrusion 157 comes into contact with an end face 120 (refer to FIGS. 2A and 2B) located behind the slider groove 113 to function as a stopper.

When the DIN-rail mount type device 100 is mounted to the DIN rail 200 herein, first, the operator engages (hooks) the engagement portion 115 protrudingly provided at the edge 114U at the upper side of the rail groove 112 with the engagement portion 201U at the upper side of the DIN rail 200 fixed with a fixing member such as a screw (not illustrated) onto a wall (not illustrated) for example, and then fits the DIN rail 200 into the rail groove 112. With this arrangement, the DIN-rail mount type device 100 can be mounted to the DIN rail 200. However, at this point, the lock member 150 fitted into the slider groove 113 is retained at the unlock position, and thus the fitting state between the rail groove 112 and the DIN rail 200 is not retained.

Figure 4A:
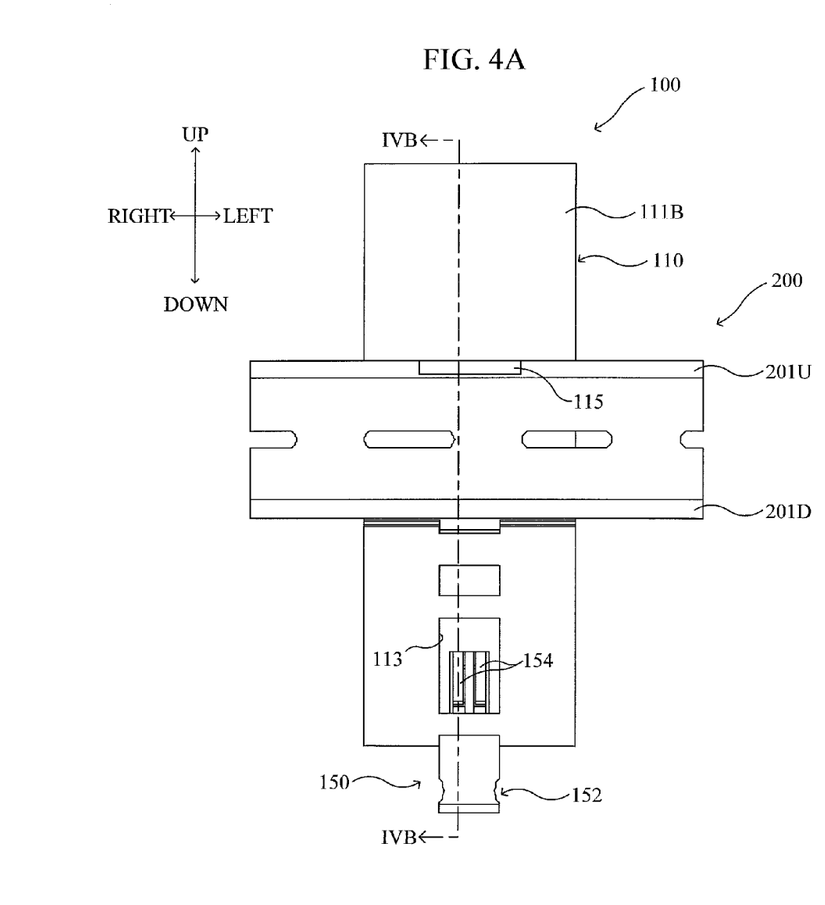
FIG. 4A is a plan view of a DIN-rail mount type device mounted to a DIN rail viewed from the back face side of the housing with the lock member retained at an unlock position.
Figure 4B:
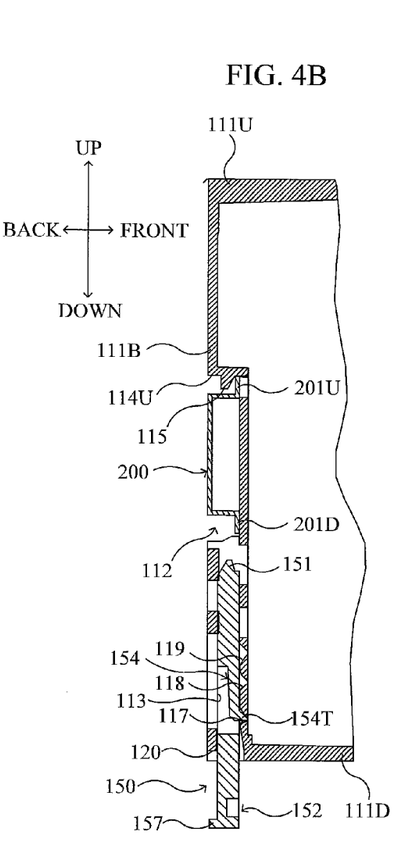
FIG. 4B is a vertical cross-sectional view of the DIN-rail mount type device along the line IVB-IVB in FIG. 4A.

As illustrated in FIGS. 4A and 4B, in a state where the lock member 150 is retained at the unlock position, the lock member 150 engages the tip end 154T of the spring portion 154 with the unlocking recess 117 provided on the bottom face of the slider groove 113. At this point, the engagement-side end 151 is stored in the slider groove 113, and the lock member 150 is not engaged with the engagement portion 201D at the lower side of the DIN rail 200. In addition, the operation-side end 152 protrudes downward out of the housing 110. In other words, in a state where the lock member 150 is retained at the unlock position, it does not engage the engagement-side end 151 with the engagement portion 201 D at the lower side of the DIN rail 200, and thus does not retain the fitting state between the rail groove 112 and the DIN rail 200. In other words, the lock member 150 does not retain the fitting state between the rail groove 112 and the DIN rail 200.

Figure 5:
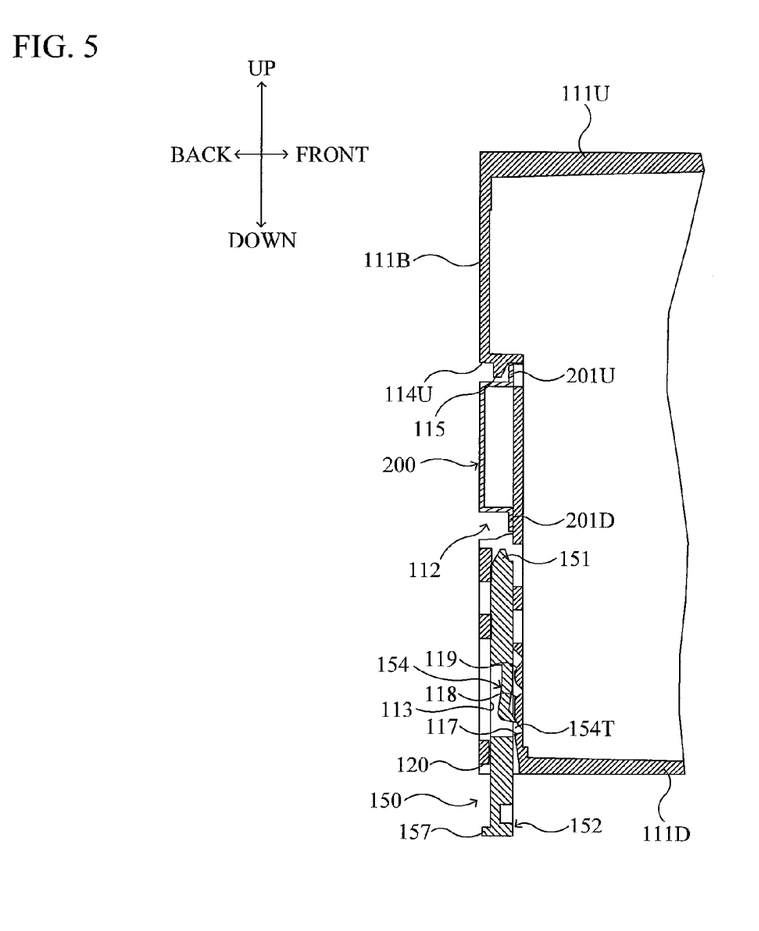
FIG. 5 illustrates a state in which a tip end of a spring portion and an unlocking recess release engagement with each other.

In this state, when the operator pushes the lock member 150 to the upper side via the operation-side end 152 protruding downward out of the housing 110, as illustrated in FIG. 5, the spring portion 154 is elastically bent backward, and the engagement between the tip end 154T of the spring portion 154 and the unlocking recess 117 is released and the lock member 150 slides to the upper side. When the tip end 154T of the spring portion 154 has moved up to a position of the locking recess 118, the backward bending of the spring portion 154 becomes smaller in the manner that the spring portion 154 can engage with the locking recess 118, and then the lock member 150 is retained at the lock position.

Figure 6A:
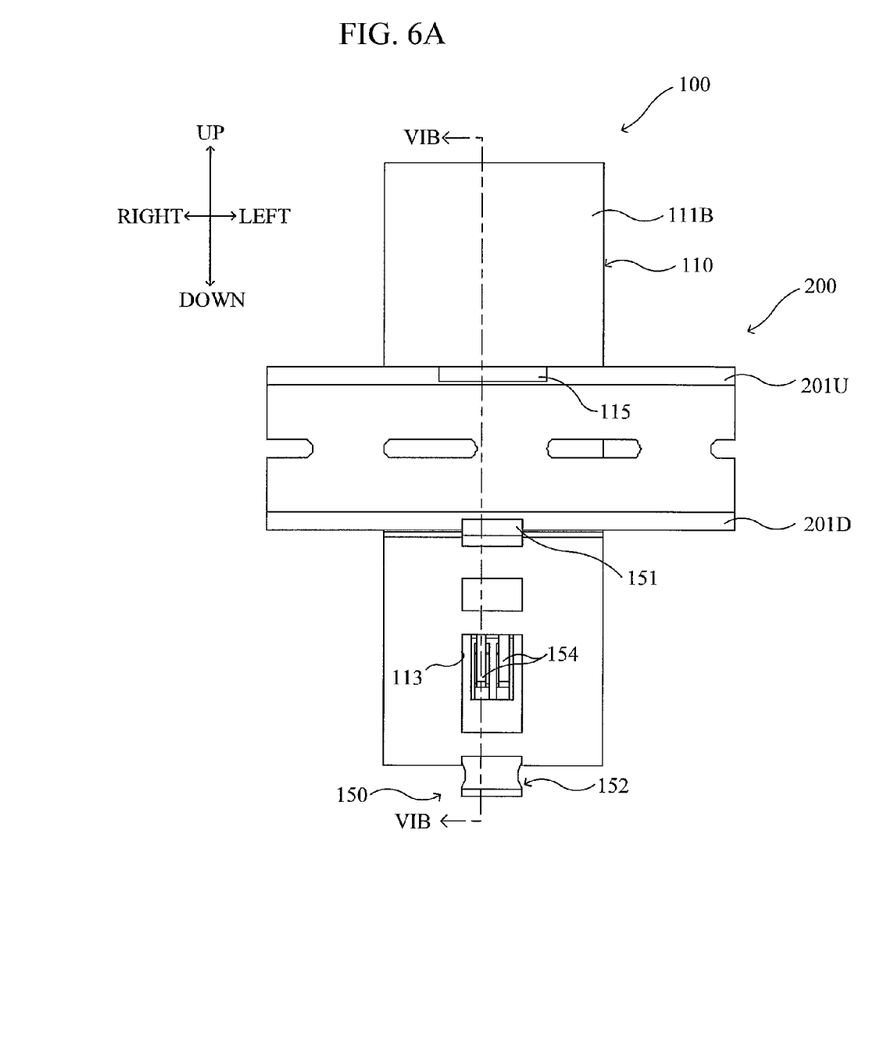
FIG. 6A is a plan view of the DIN-rail mount type device mounted to the DIN rail viewed from the back face side of the housing with the lock member retained at a lock position.
Figure 6B:
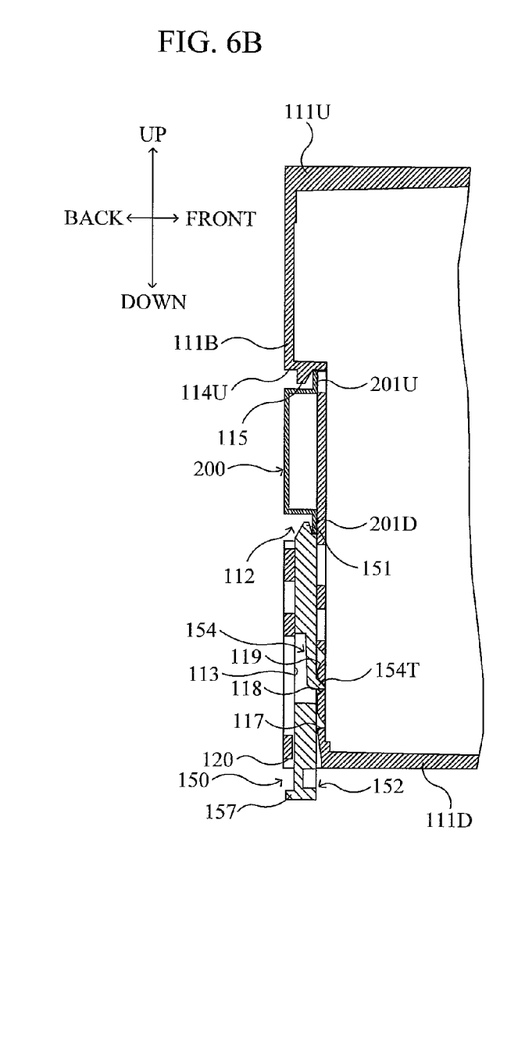
FIG. 6B is a vertical cross-sectional view of the DIN-rail mount type device along the line VIB-VIB in FIG. 6A.

As illustrated in FIGS. 6A and 6B, in a state where the lock member 150 is retained at the lock position, the lock member 150 engages the tip end 154T of the spring portion 154 with the locking recess 118 provided on the bottom face of the slider groove 113. At this point, the engagement-side end 151 of the lock member 150 protrudes from the slider groove 113 into the rail groove 112, and engages with the engagement portion 201D at the lower side of the DIN rail 200. Further, in addition, the operation-side end 152 protrudes downward out of the housing 110. In other words, in a state where the lock member 150 is retained at the lock position, the lock member 150 engages the engagement-side end 151 with the engagement portion 201D at the lower side of the DIN rail 200 to retain the fitting state between the rail groove 112 and the DIN rail 200. More specifically, the lock member 150 retains the fitting state between the rail groove 112 and the DIN rail 200.

In this state, when the DIN-rail mount type device 100 is removed from the DIN rail 200, the operator first draws the lock member 150 downward via the operation-side end 152 protruding downward out of the housing 110, and moves the lock member 150 to the unlock position to make a state where the lock member 150 does not retain the fitting state between the rail groove 112 and the DIN rail 200. In this state, the DIN-rail mount type device 100 is removed from the DIN rail 200. At this point, to cause the lock member 150 protruding downward out of the housing 110 not to protrude out of the housing 110, the lock member 150 may be moved to the storage position. In other words, the operator pushes the lock member 150 upward via the operation-side end 152 protruding downward out of the housing 110 to engage the tip end 154T of the spring portion 154 with the storing recess 119. With this arrangement, the lock member 150 is retained at the storage position.

Figure 7A:
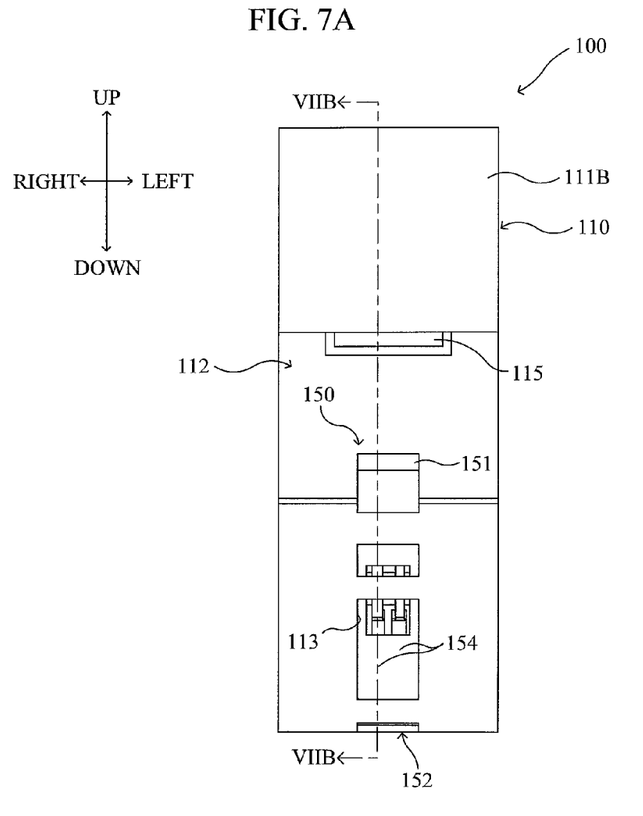
FIG. 7A is a plan view of the DIN-rail mount type device removed from the DIN rail viewed from the back face side of the housing with the lock member retained at a storage position.
Figure 7B:
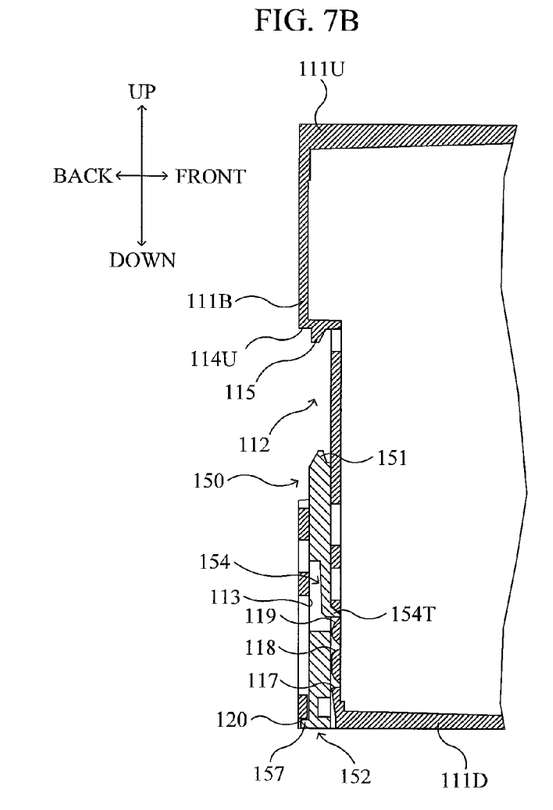
FIG. 7B is a vertical cross-sectional view of the DIN-rail mount type device along the line VIIB-VIIB in FIG. 7A.

As illustrated in FIGS. 7A and 7B, in a state where the lock member 150 is retained at the storage position, the lock member 150 engages the tip end 154T of the spring portion 154 with the storing recess 119 provided on the bottom face of the slider groove 113. At this point, the engagement-side end 151 of the lock member 150 protrudes from the slider groove 113 into the rail groove 112. In addition, the operation-side end 152 is stored in the slider groove 113. In other words, in the state where the lock member 150 is retained at the storage position, the operation-side end 152 of the lock member 150 is stored in the slider groove 113, and thus the lock member 150 does not protrude downward out of the housing 110. Further, in this state, the protrusion 157 of the operation-side end 152 is in contact with the above-described end face 120.

In this state, when the DIN-rail mount type device 100 is mounted to the DIN rail 200, the operator pushes the lock member 150 downward via the engagement-side end 151 protruding into the rail groove 112, draws the operation-side end 152 more downward than the slider groove 113, and draws the operation-side end 152 downward to engage the tip end 154T of the spring portion 154 with the unlocking recess 117. With this arrangement, since the lock member 150 is retained at the unlock position, as described above, the DIN-rail mount type device 100 can be mounted to the DIN rail 200.

As described above, the DIN-rail mount type device 100 according to the present embodiment includes the housing 110 provided with the rail groove 112 and the slider groove 113 on its back face 111B, and the lock member 150 that slides to move forward and backward with respect to the rail groove 112 in the slider groove 113 and can retain the fitting state between the rail groove 112 and the DIN rail 200 by engaging the engagement-side end 151 with the engagement portion 201D at the lower side of the DIN rail 200. The lock member 150 can move to the unlock position, lock position, and storage position described above, and only when the DIN rail 200 is not fitted into the rail groove 112, the lock member 150 can move to the storage position.

With this arrangement, in a state where the DIN rail 200 is not fitted into the rail groove 112, in other words, in a state where the DIN-rail mount type device 100 is removed from the DIN rail 200, the lock member 150 moves to the storage position in the manner that the operation-side end 152 of the lock member 150 is stored in the slider groove 113 and thus does not protrude out of the housing 110. As a result, the operator working on the DIN-rail mount type device 100 in a removed state can be prevent from getting wounded by the protruding lock member 150, and further packaging can be facilitated. Further, the lock member 150 can be prevented from being damaged while it is conveyed, and the DIN-rail mount type device 100 can be horizontally placed with a side of the lock member 150 facing downward. Furthermore, if the DIN-rail mount type device 100 includes the fixing mechanism such as the screw, and when it is not mounted to the DIN rail 200 but fixed with the screw or the like, the wasteful installation space for avoiding the protruding lock member 150 is required when the lock member 150 protrudes. However, according to the present embodiment, since the lock member 150 can be stored, the installation space can be minimized.

Moreover, since, only when the DIN rail 200 is not fitted into the rail groove 112, the lock member 150 can move to the storage position, in a state where the DIN rail 200 is fitted into the rail groove 112, whether the fitting state is retained or not, the lock member 150 is located at a position other than the storage position (i.e., the lock position or the unlock position). In the state where the DIN rail 200 is fitted into the rail groove 112, to switch the fitting state between retaining (locking) and releasing (unlocking), the operator is required to operate the lock member 150, but, since the lock member 150 is located at the position other than the storage position (the lock position or the unlock position) and thus the operation-side end 152 protrudes out of the housing 110, the operator can easily operate the lock member 150 using the operation-side end 152.

Further, when the operation-side end 152 is located at the storage position where the lock member 150 is stored in the slider groove 113, the engagement-side end 151 of the lock member 150 protrudes from the slider groove 113 into the rail groove 112. At this point, since the DIN rail 200 is not fitted into the rail groove 112, the operator pushes downward the engagement-side end 151 protruding into the rail groove 112 to draw the operation-side end 152 lower than the slider groove 113, in the manner that the operation-side end 152 can protrude out of the housing 110. As a result, the operator can operate the lock member 150 from the storage position to the lock position and the unlock position using the operation-side end 152.

Furthermore, according to the present embodiment, the following effects can be acquired. Specifically, for example, when, in a state where the lock member 150 retains the fitting state between the rail groove 112 and the DIN rail 200 (described as a "lock state" hereinafter), the lock member 150 is to be set at the above-described storage position, and when, in a state where the fitting state is not retained (described as an "unlock state"), the lock member 150 is to be set to the above-described unlock position, since the operation-side end 152 of the lock member 150 is stored in the slider groove 113 and does not protrude downward out of the housing 110 in the lock state, even if the operator attempts to switch the lock state to the unlock state, an operation of the lock member 150 becomes difficult.

According to the present embodiment, since the operation-side end 152 of the lock member 150 protrudes downward out of the housing 110 even in the lock state, the operator can operate the lock member 150 using the operation-side end 152 to easily switch the lock state to the unlock state. Further, since the operation-side end 152 of the lock member 150 protrudes out of the housing 110 even in the unlock state, the operator can operate the lock member 150 using the operation-side end 152 to easily switch the unlock state to the lock state. As described above, switching operability between the lock state and the unlock state can be improved.

Furthermore, according to the present embodiment, particularly, the spring portion 154 is included that is capable of retaining the lock member 150 at the unlock position, the lock position, and the storage position when the lock member 150 is sequentially engaged with the unlocking recess 117, the locking recess 118, and the storing recess 119 provided in the slider groove 113 when the lock member 150 slides in the slider groove 113. The spring portion 154 is sequentially engaged with the unlocking recess 117, the locking recess 118, and the storing recess 119 provided in the slider groove 113 to retain the lock member 150 at the unlock position, the lock position, and the storage position.

The present embodiment is not limited to the above-described content, and variety of modifications may be made to the embodiments without departing from the spirit and technical idea of the present disclosure. Examples of such modifications will be described below.

(1) When Lock Mechanisms are Provided at a Plurality of Positions

According to the above-described present embodiment, one slider groove 113 is provided on the back face 111B of the housing 110, and the lock member 150 is provided in the slider groove 113, but they are not limited thereto. In other words, a plurality of slider grooves may be provided on the back face of the housing and the lock member 150 may be individually provided in each of the plurality of slider grooves.

Figure 8:
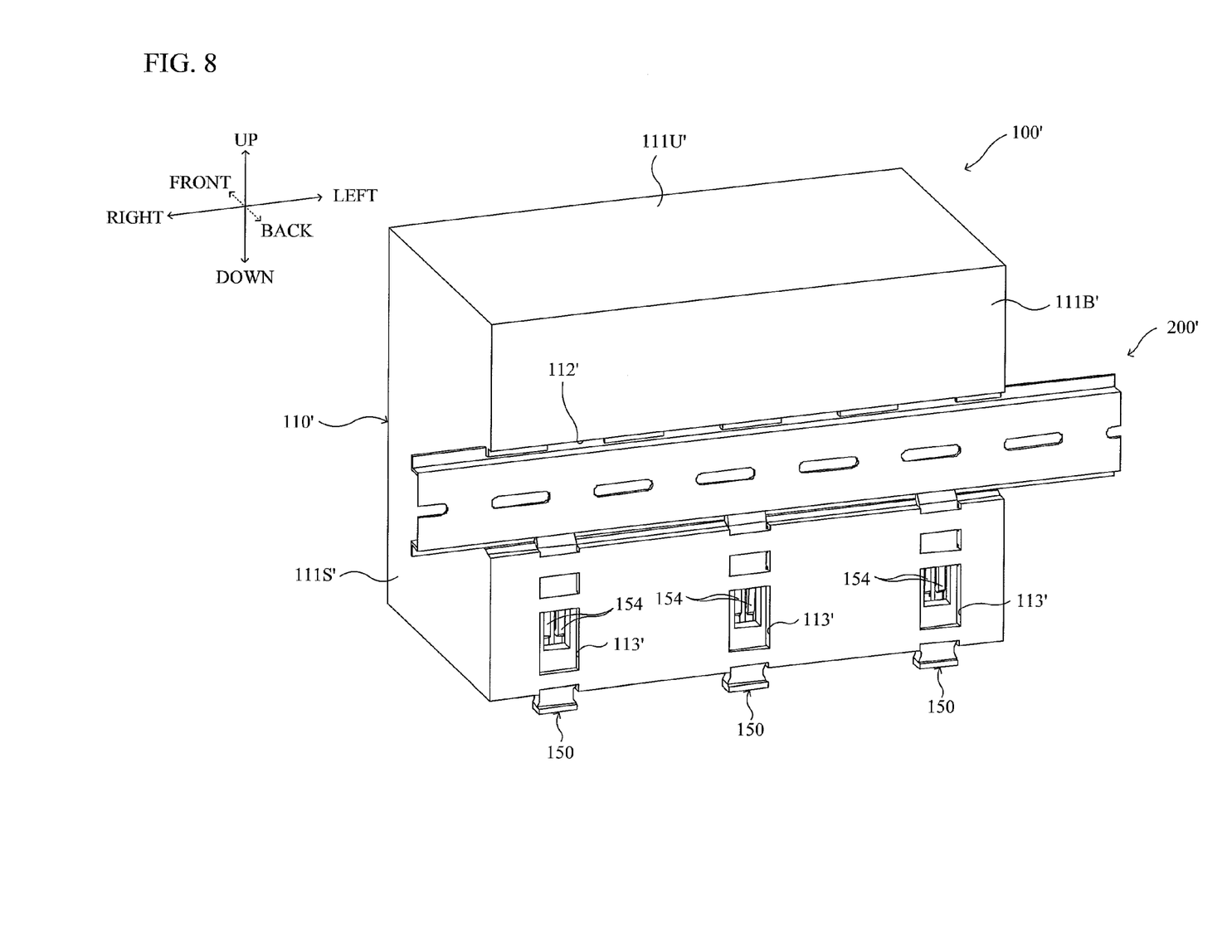
FIG. 8 is a perspective view illustrating an outer appearance of a DIN-rail mount type device according to a modification in which a lock mechanism is provided at a plurality of positions.

In FIG. 8, a DIN-rail mount type device 100', which is a present modification, includes a front face (not illustrated), a back face 111B', an upper face 111U', a lower face (not illustrated), and both right and left side faces 111S, and a housing 110' formed in a substantially cuboidal shape, and the above-described lock member 150. According to the present modification, the back face 111B' of the housing 110' corresponds to the face of the housing described in the scope of the claims. Alternatively, the face other than the back face 111B' of the housing 110' (e.g., a front face of the housing 110') may be defined as the face of the housing.

The housing 110' has a greater length in the width direction, in other words, the right and left direction than that of the above-described housing 110, and a rail groove 112' capable of fitting with a DIN rail 200' having the greater length in the right and left direction than that of the above-described DIN rail 200 is provided on the back face 111B' so as to extend over an entire length in the right and left direction of the back face 111B' along the right and left direction. Further, on a face at a lower side than the rail groove 112' on the back face 111B' of the housing 110', a plurality of (three according to this example) slider grooves 113' into which the lock member 150 is slidably fitted is provided in parallel so as to extend over the entire length in the upward and downward direction of the face along the width direction, in other words, in the upward and downward direction of the rail groove 112'. A configuration of each of the three slider grooves 113' is same as that of the above-described slider groove 113. Furthermore, a configuration of the housing 110' that is not described above is substantially same as that of the above-described housing 110.

The lock member 150 is individually fitted into each of the above-described slider grooves 113'. In other words, the lock member 150 is individually provided in each of the above-described three slider grooves 113'. Each lock member 150 is individually retained at any of the above-described unlock position, the lock position, and the storage position by the spring portion 154 in each of the slider grooves 113'. According to the example illustrated in FIG. 8, each lock member 150 is retained at the lock position.

According to the present modification described above, the plurality of slider grooves 113' is provided on the back face 111B' of the housing 110', and each lock member 150 is individually provided in the plurality of slider grooves 113'. With this arrangement, even the DIN-rail mount type device 100' having the comparatively great length in the width direction of the housing 110' can stably retain the fitting state between the rail groove 112 and the DIN rail 200 using the plurality of lock members 150. Further, since each lock member 150 is individually retained at any of the unlock position, the lock position, and the storage position by the spring portion 154 in the each slider groove 113', when the DIN-rail mount type device 100' is mounted/removed to/from the DIN rail 200', the operator is not required to operate the plurality of lock members 150 with forces at a time, thereby maintaining preferable operability.

(2) Others

In the above, the slider groove 113, 113' is provided on a face at the lower side than the rail groove 112, 112' on the back face 111B, 111B', but they are not limited thereto, and may be provided on a face at an upper side than the rail groove 112, 112' on the back face 111B, 111B'. Also in this case, the similar effects to those of the above-described embodiment and the modification of (1) can be acquired.

Further, in addition to the examples described above, methods of the above-described embodiment and each modification may be appropriately combined to be used.

Others are not described, but, various types of changes are added to implement the above-described embodiment and each modification without departing from the spirit and scope of the present disclosure.

What is claimed is:

1. A DIN-rail mount type device comprising:
   a housing;
   a rail groove provided along a width direction of the housing on a face of the housing and being capable of fitting with the DIN rail;
   a slider groove provided along a width direction of the rail groove on the face of the housing; and
   a lock member configured to slide so as to move forward and backward with respect to the rail groove in the slider groove, and to be able to retain a fitting state between the rail groove and the DIN rail by engaging a one-side end with an engagement portion of the DIN rail fitted into the rail groove, configured to be able to move to a first position where the one-side end protrudes from the slider groove into the rail groove, and other-side end protrudes out of the housing and to a second position where the one-side end protrudes from the slider groove into the rail groove and the other-side end is stored in the slider groove, configured to be able to retain the fitting state between the rail groove and the DIN rail by engaging the one-side end with the engagement portion of the DIN rail at the first position, and configured to be able to move to the second position only when the DIN rail is not fitted into the rail groove,
   wherein the lock member comprises a protrusion configured to come into contact with an end face of the housing to regulate a movement toward the one-side end of the lock member when the lock member moves to the second position.

2. The DIN-rail mount type device according to claim 1, wherein:
   the lock member is configured to be able to move to a third position where the one-side end is stored in the slider groove and the other-side end protrudes out of the housing, and to move between the third position and the second position.

3. The DIN-rail mown type device according to claim 2, wherein:
   the lock member comprises at least one spring portion configured to be able to retain, when the lock member moves in the slider groove, the lock member at the first position, the second position, and the third position by sequentially engaging with a plurality of recesses provided in the slider groove.

4. The DIN-rail mount type device according to claim 3, wherein:
   the spring portion is configured to engage or release with the recess while being elastically bent in a depth direction of the housing.

5. The DIN-rail mount type device according to claim 1, wherein:
   a plurality of the slider grooves is provided in parallel on the face of the housing; and wherein the lock member is individually provided in the plurality of the slider grooves.

6. The DIN-rail mount type device according to claim 2, wherein:
   a plurality of the slider grooves is provided in parallel on the face of the housing; and wherein the lock member is individually provided in the plurality of the slider grooves.

7. The DIN-rail mount type device according to claim 3, wherein:
   a plurality of the slider grooves is provided in parallel on the face of the housing; and wherein the lock member is individually provided in the plurality of the slider grooves.

8. The DIN-rail mount type device according to claim 4, wherein:
   a plurality of the slider grooves is provided in parallel on the thee of the housing; and wherein the lock member is individually provided in the plurality of the slider grooves.

9. A DIN-rail mourn type device comprising:
   a housing;
   a rail groove provided along a width direction of the housing on a face of the housing and being capable of fitting with the DIN rail;
   a slider groove provided along a width direction of the rail groove on the face of the housing; and
   a lock member configured to slide so as to move forward and backward with respect to the rail groove in the slider groove, configured to he able to move to a first position where the one-side end protrudes from the slider groove into the rail groove, and other-side end protrudes out of the housing, to a second position where the one-side end protrudes from the slider groove into the rail groove and the other-side end is stored in the slider groove, and to a third position where the one-side end is stored in the slider groove and the other-side end protrudes out of the housing, to be able to retain a fitting state between the rail groove and the DIN rail by engaging the one-side end with an engagement portion of the DIN rail at the first position, configured to be able to move to the second position only when the DIN rail is not fitted into the rail groove, comprising at least one spring portion configured, when the lock member moves in the slider groove, to be able to retain the lock member at the first position, the second position, and the third position by sequentially engaging with a plurality of recesses provided in the slider groove, and further comprising at the other-side end a protrusion configured to function as a stopper when moving to the second position and to be stored in the housing.

10. A DIN-rail mount type device comprising:
    a housing;
    a rail groove provided along a width direction of the housing on a face of the housing and being capable of fitting with the DIN rail;
    a slider groove provided along a width direction of the rail groove on the face of the housing; and a lock member configured to slide so as to move forward and backward with respect to the rail groove in the slider groove, and to he able to retain a fitting state between the rail groove and the DIN rail by engaging a one-side end with an engagement portion of the DIN rail fitted into the rail groove, configured to be able to move to a first position where the one-side end protrudes from the slider groove into the rail groove, and other-side end protrudes out of the housing and to a second position where the one-side end protrudes from the slider groove into the rail groove and the other-side end is stored in the slider groove, configured to be able to retain the fitting state between the rail groove and the DIN rail by engaging the one-side end with the engagement portion of the DEN rail at the first position, and configured to be able to move to the second position only when the DIN rail is not fitted into the rail groove, wherein the lock member is configured to he able to move to a third position where the one-side end is stored in the slider groove and the other-side end protrudes out of the housing.

11. The DIN-rail mount type device according to claim 10, wherein:
the lock member is configured to move between the third position and the second position.

12. The DIN-rail mount type device according to claim 11, wherein:
the lock member comprises at least one spring portion configured to be able to retain, when the lock member moves in the slider groove, the lock member at the first position, the second position, and the third position by sequentially engaging with a plurality of recesses provided in the slider groove.

13. The DIN-rail mount type device according to claim 12, wherein:
the spring portion is configured to engage or release with the recess while being elastically bent in a depth direction of the housing.

14. The DIN-mil mount type device according to claim 10, wherein:
the lock member comprises at least one spring portion configured to be able to retain, when the lock member moves in the slider groove, the lock member at the first position, the second position, and the third position by sequentially engaging with a plurality of recesses provided in the slider groove.

15. The DIN-rail mount type device according to claim 14, wherein:
the spring portion is configured to engage or release with the recess while being elastically bent in a depth direction of the housing.

16. A DIN-rail mount type device comprising:
a housing;
a rail groove provided along a width direction of the housing on a face of the housing and being capable of fitting with the DIN rail;
a plurality of slider grooves provided along a width direction of the rail groove in parallel on the face of the housing; and
a lock member configured to slide so as to move forward and backward with respect to the rail groove in the slider groove, and to be able to retain a fitting state between the rail groove and the DIN rail by engaging a one-side end with an engagement portion of the DIN rail fitted into the rail groove, configured to be able to move to a first position where the one-side end protrudes from the slider groove into the rail groove, and other-side end protrudes out of the housing and to a second position where the one-side end protrudes from the slider groove into the rail groove and the other-side end is stored in the slider groove, configured to be able to retain the fitting state between the rail groove and the DIN rail by engaging the one-side end with the engagement portion of the DIN rail at the first position, and configured to be able to move to the second position only when the DIN rail is not fitted into the rail groove, wherein the lock member is individually provided in the plurality of slider grooves.

* * * * *